(12) United States Patent
Ludwig

(10) Patent No.: US 8,916,079 B2
(45) Date of Patent: Dec. 23, 2014

(54) METHOD FOR PRODUCING AN ELECTRONIC COMPONENT

(75) Inventor: Ronny Ludwig, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 420 days.

(21) Appl. No.: 13/381,273

(22) PCT Filed: Apr. 30, 2010

(86) PCT No.: PCT/EP2010/055882
§ 371 (c)(1), (2), (4) Date: Mar. 12, 2012

(87) PCT Pub. No.: WO2011/000597
PCT Pub. Date: Jan. 6, 2011

(65) Prior Publication Data
US 2012/0161362 A1    Jun. 28, 2012

(30) Foreign Application Priority Data
Jun. 30, 2009   (DE) .......................... 10 2009 027 343

(51) Int. Cl.
*B29C 69/02* (2006.01)
*H01L 23/31* (2006.01)
*H01L 21/56* (2006.01)

(52) U.S. Cl.
CPC .......... *H01L 23/3135* (2013.01); *H01L 21/565* (2013.01); *H01L 2924/1433* (2013.01); *H01L 2224/48137* (2013.01); *H01L 2924/19105* (2013.01)
USPC ....................... 264/272.11; 264/261; 264/259

(58) Field of Classification Search
CPC .................. B29C 45/14344; B29C 45/14639; B29C 45/14655
USPC ...................... 264/272.11, 261, 259
See application file for complete search history.

(56) References Cited

U.S. PATENT DOCUMENTS 6,091,157 A   7/2000 Black et al.
6,891,730 B2 *  5/2005 Farassat ....................... 361/769

FOREIGN PATENT DOCUMENTS

| DE | 197 36 090 | 3/1999 |
|----|------------|--------|
| GB | 1 329 810 | 9/1973 |
| JP | 61-189656 | 8/1986 |
| JP | 3-216607 | 9/1991 |
| JP | 2002-515640 | 5/2002 |
| JP | 2003-66058 | 3/2003 |
| JP | 2005-7872 | 1/2005 |
| JP | 2008-62602 | 3/2008 |
| WO | WO 99/16132 | 4/1999 |

OTHER PUBLICATIONS

International Search Report for PCT/EP2010/055882, dated Sep. 1, 2010.

* cited by examiner

Primary Examiner — Galen Hauth
(74) Attorney, Agent, or Firm — Kenyon & Kenyon LLP

(57) ABSTRACT

A method for producing an electronic component includes: providing at least one carrier element having a microcomponent receptacle configured for contacting at least one microcomponent, injection molding a housing around the carrier element, the microcomponent receptacle being situated in a cavity of the housing that is open on at least one side, introducing the microcomponent into the microcomponent receptacle in the cavity to contact the microcomponent to the carrier element, and injecting the cavity using a filler material to fix the microcomponent in the housing and in the microcomponent receptacle.

7 Claims, 15 Drawing Sheets

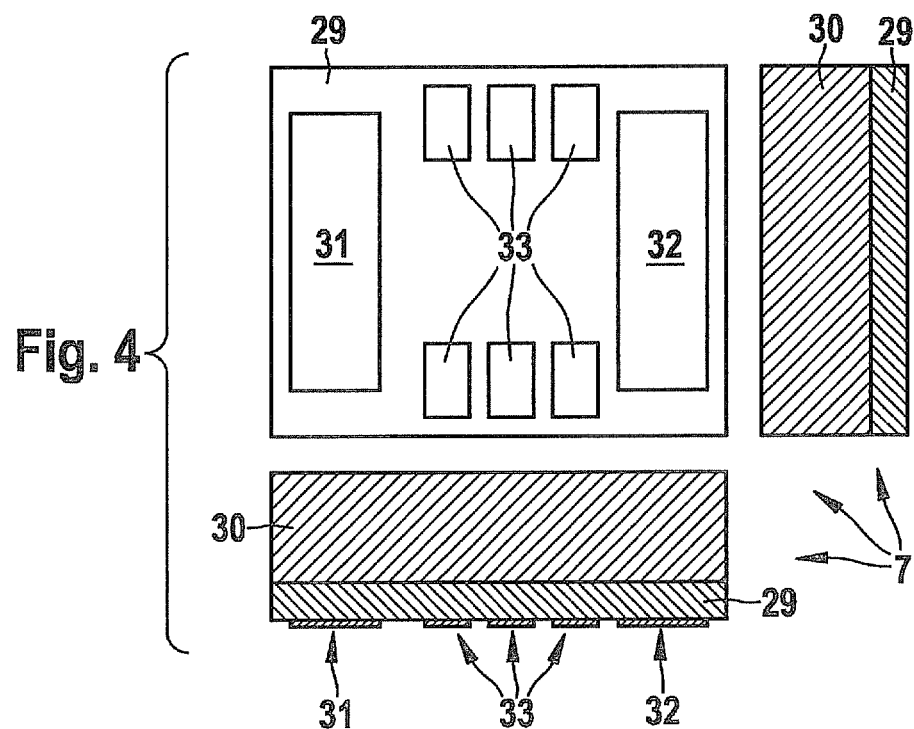
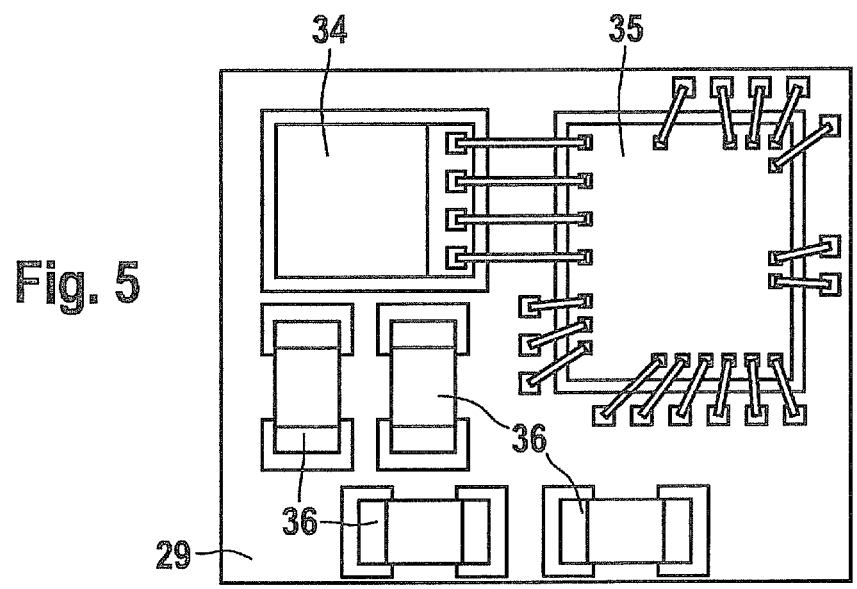

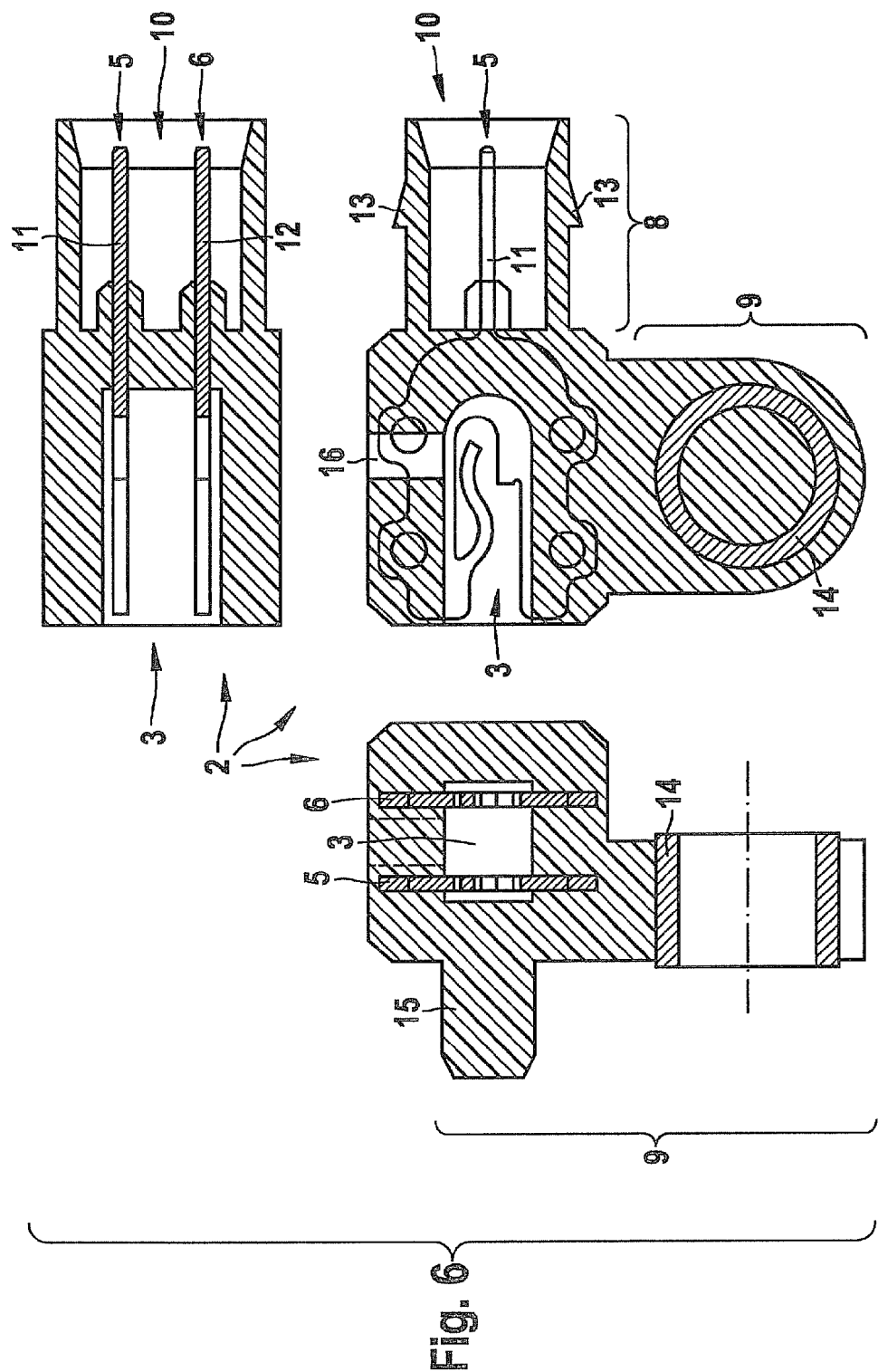

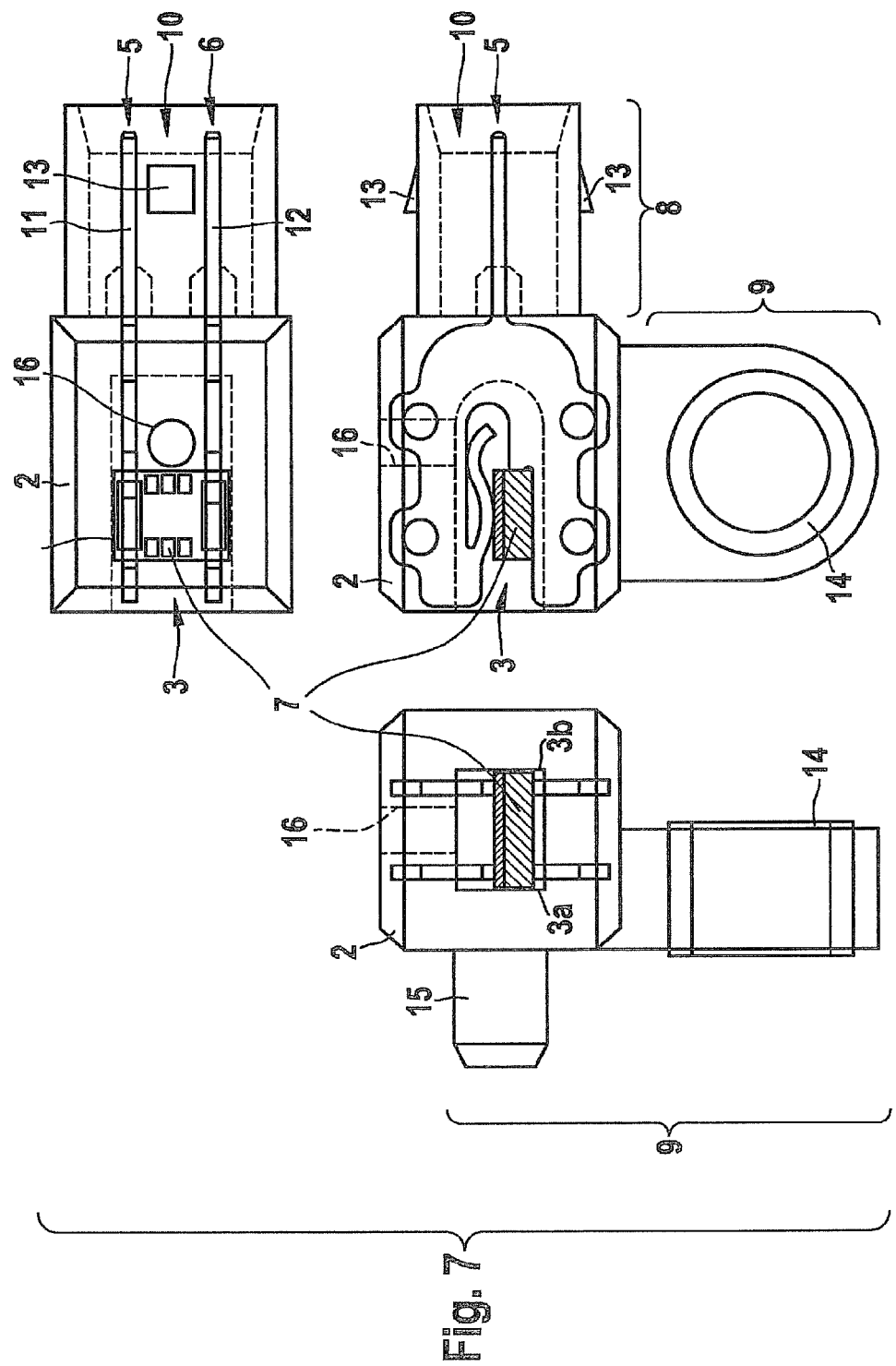

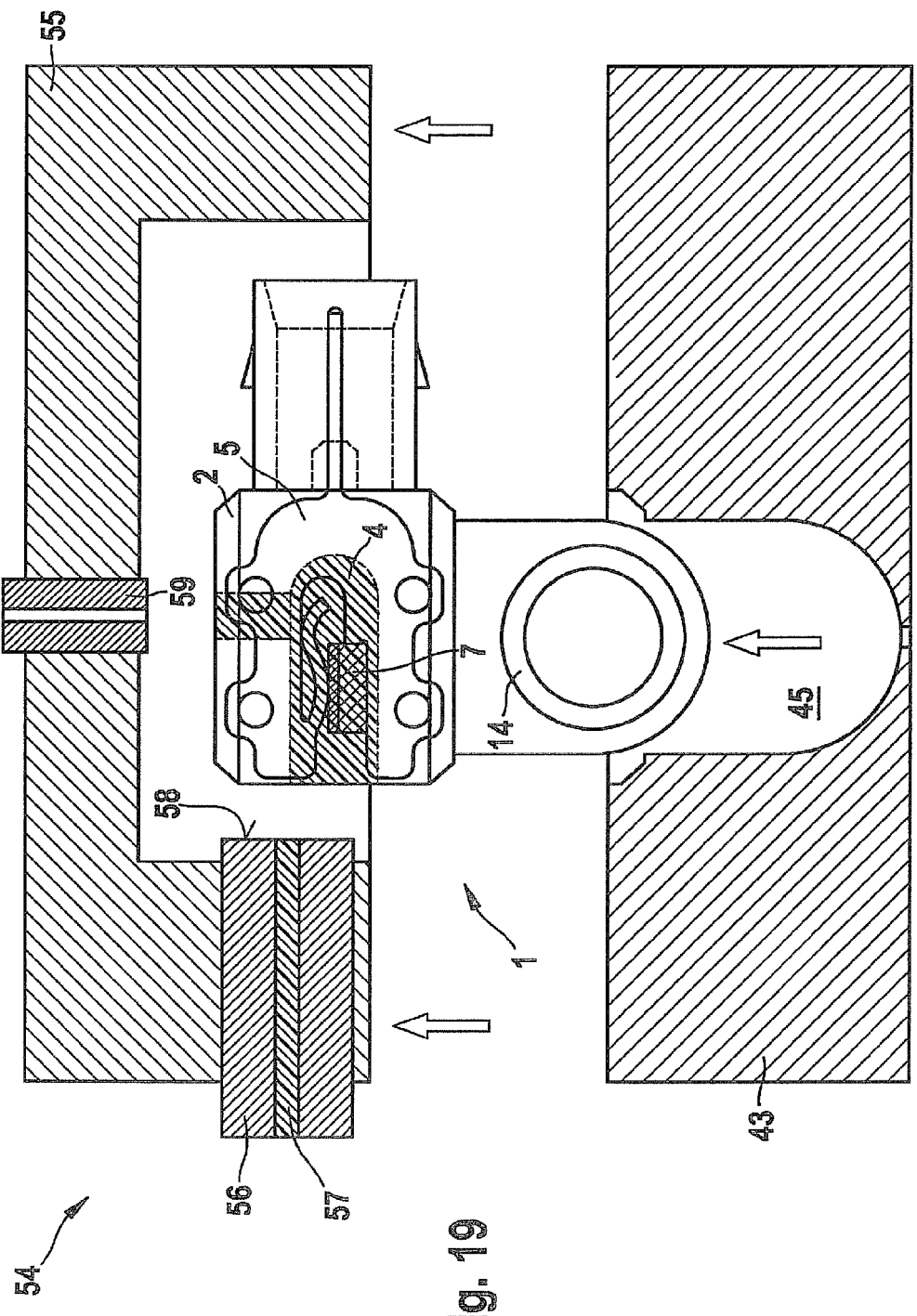

METHOD FOR PRODUCING AN ELECTRONIC COMPONENT

BACKGROUND OF THE INVENTION

1. Field of the Invention

The present invention relates to a method and a carrier element for producing an electronic component, particularly a sensor for use in a motor vehicle.

2. Description of Related Art

The known concepts in the packaging of sensors use design approaches that are becoming ever smaller and are fully integrated for implementing the function. Housing concepts for "packaging" sensor chips, e.g. "land grid arrays" integrate all the components of a circuit into a tiny encasing (mold compound), which includes only a few cubic millimeters. Such miniaturized circuits represent an enormous challenge for "second-level packaging", that is, the further processing to form a sensor having opportunities for fastening and plug connectors.

Since such miniaturized circuits, as for instance LGA's, no longer require any printed circuit board or other circuit substrates, these are typically mounted directly in surrounding sensor housings. As an approach in this instance, one may use the 2-component injection molding method, in which the LGA housing, that is connected using a metallic carrier strip, is first extrusion-coated with a relatively soft material, such as silicone, in a first step, and, in an additional step, this construct is, in turn, extrusion-coated with a housing plastic in an injection molding method. This sequence is necessary because the pressures, required in the plastic injection molding of several 100 bar, would damage the LGA housing in such a way that at least the durable function of the circuit is not assured. However, even the previous extrusion-coating, using a damping material such as silicone, represents some danger: As, for instance, the displacement of the silicone material when the plastic mass comes down on one side or, for example, the penetration of the silicone, because of the high pressure that is present during the plastic injecting, into the electrical contact location between the LGA housing and the metallic carrier element. Consequently, the use of a purely mechanical terminal connection for the electronic contact is questionable, and one has to get around it by going to materially integral connections such as soldering connections. Because of current RoHS Regulations (EG-Regulation 2002/95/EG on the restriction of the use of certain hazardous substances in electrical units and electronic units) the latter must not contain any lead and, because of the content of required flux in the solder, they represent a not inconsiderable risk of the contamination and carrying over of flux into the silicone mass during the first injection molding process. In addition, at soldering locations without lead, there is created the problem of whisker formation.

BRIEF SUMMARY OF THE INVENTION

The method according to the present invention, for producing an electronic component, makes possible diverse cost savings opportunities, both in the selection of material and raw material and in the production and assembly. This is achieved, among other things, by being able to use a microcomponent without a printed circuit board, a so-called LGA. Furthermore, because of the sequence of method steps of the present invention, the housing is able to be injection-molded under usual conditions, such as high temperatures and high pressure. The microcomponent, in this context, does not have to be taken into account, since it has not yet been mounted at the time of the housing injection molding. Moreover, the microcomponent no longer has to be connected via a materially integral connection, such as by soldering. Because of that, the object of having a solder-free and particularly a lead-free connection has been attained in a simple and cost-effective manner. At the same time, contamination of the filling material, such as silicone, by the flux of the solder is avoided. The introduction of the filler material is possible using very slight pressure, whereby stress loading of the microcomponent is avoided to a great extent. Furthermore, the method according to the present invention also makes possible an extremely variable production of the electronic components. Because of the assembly sequence according to the present invention, the most varied sizes and/or the most varied application areas are able to be mounted in the same housing. All these advantages are made possible by a method, according to the present invention, for producing an electronic component, encompassing the steps carried out in the following sequence:

providing at least one carrier element including a microcomponent receptacle developed for contacting at least one microcomponent, injection molding a housing around the carrier element, the microcomponent receptacle being situated in a cavity of the housing that is open at least on one side, introducing the at least one microcomponent into the microcomponent in the cavity, in order to contact the at least one microcomponent to the carrier element, and injecting the cavity using a filler material, in order to fix the contacted, at least one microcomponent in the housing and in the microcomponent receptacle.

The carrier element is preferably made of a metallic material. Silicone or fusion adhesive are preferably used as the filler material. The filler material advantageously takes on several functions, such as protecting the microcomponents from environmental influences, mechanical fixing and fastening the microcomponent in the housing, as well as damping the microcomponent. The housing is preferably made of a thermoplastic. In the production of the electronic component, the outer housing is first produced with the carrier element as an insertion part, according to the present invention. The microcomponent is then pushed in and contacted to the carrier element. Now, in order to fix this microcomponent in the housing, the remaining cavity is injected full of the filler material. The high pressures and temperatures, that are required for producing the housing, thus stress neither the microcomponent, the contact locations between the microcomponent and the carrier element nor the filler material. The use of both a single microcomponent and a plurality of microcomponents in the microcomponent receptacle is preferred. To simplify the representation, we shall show below the variant having one microcomponent.

In one advantageous embodiment, the electronic component includes two carrier elements and the microcomponent includes two contact pads. The two contact pads are each contacted to a microcomponent receptacle of a carrier element, the two microcomponent receptacles of the two carrier elements being situated in common in the cavity. Thus, the microcomponent is able to be contacted via two metallic carrier elements that are insulated from each other.

In one embodiment, the cavity is larger than the microcomponent. Because of that, the microcomponent can be completely encased by the filler material with the exception of contact locations of the microcomponent to the carrier element and/or the housing. Such contact locations are in first place the contacts between the contact pad and the microcomponent receptacle of the carrier element. As will also be shown below, additional contact locations are also possible, such as the contact between a stop developed on the carrier element and the microcomponent. Furthermore, it is possible for the microcomponent to lie laterally to the housing, that is, the inner wall of the cavity, and is thereby guided or clamped.

It is advantageously provided that the microcomponent is clamped in the microcomponent receptacle when the microcomponent is introduced into the microcomponent receptacle. As was mentioned above, this clamping may take place because the microcomponent lies laterally against the inner wall of the cavity, for example, and thus is both guided via the inner wall of the cavity as well as clamped. Because of this lateral guidance of the microcomponent, very tight tolerances with regard to a possible rotation of the microcomponent have to be maintained. Alternatively or in addition to this lateral guidance and/or clamping of the microcomponent between the inner walls of the cavity, clamping the microcomponent using a spring element is above all of advantage. Such a spring element, in particular, developed in the microcomponent receptacle at the carrier element is used both for contacting the microcomponent and for clamping the microcomponent. Such a spring element, of course, remains free during the injection molding around the carrier element with the housing, and acts advantageously on the contact pads of the microcomponent. The position tolerance of the microcomponent within the cavity is able to be set very tightly by this clamping, i.e. the microcomponent is very accurately guided by the spring elements and/or the lateral guidance at the inner walls of the cavity. This makes possible very low setpoint errors and cross sensitivity errors when using a sensor in the microcomponent. For the final fixing of the microcomponent in the housing, in addition to the clamping, the cavity is naturally injected full of the filler material.

In one embodiment of the method according to the present invention, the use is provided of a multi-part, particularly two-component injection molding die. This injection molding die includes a first tool part having a first injection molding cavity, a second tool part having a second injection molding cavity and a cavity slide. In this context, the first injection molding cavity and the second injection molding cavity together determine the outer shape of the housing. Furthermore, during the molding of the carrier element with the housing, the cavity slide extends into the first injection molding cavity and/or the second injection molding cavity, to determining the cavity. The design of this injection molding die makes possible an efficient and cost-effective execution of the method. The use of the cavity slide makes possible defining the cavity exactly, the microcomponent receptacle of the carrier element or the carrier elements, in particular, remaining free from the material of the housing.

For the introduction of the microcomponent into the microcomponent receptacle, the housing advantageously remains in the first tool part. The second tool part and the cavity slide are set apart from the housing for the introduction of the microcomponent. For this purpose, the cavity slide is advantageously integrated in the second tool part. Thus, the first tool part is used at the same time as mounting support of the housing during the mounting of the microcomponent and a time-consuming implementation of the housing is avoided.

It is also advantageous that, for the injecting of the cavity full of filler material, the housing remains in the first tool part, and the filler material is injected into the cavity using an injection slide. Consequently, the housing also remains in the first tool part in this method step, the injection of the filler material. Thus, this tool part is advantageously used as the fastening and/or mounting support of the electronic component until its finished production. In a particularly preferred manner, to carry out the method according to the present invention, a rotary table having at least four positions is used. On this rotary table the first tool part is placed which, at the beginning of production, represents a part of the cavity for the housing, and further along in the production represents a mounting support of the housing. The four positions during the production are advantageously as follows:

In the first position, the injection molding of the housing takes place. In the second position, the microcomponent is mounted in the microcomponent receptacle or pushed into it. In the third position, the injecting full of the cavity with the filler material takes place. At the fourth position, the finished electronic component is taken out, as well as the assembling of the injection molding die with carrier elements and a possible socket for the electronic component that is to be produced subsequently.

In an additional advantageous embodiment it is provided that the first injection molding cavity determines a fastening form element of the housing. Via such a fastening form element, the electronic component according to the present invention, may be screwed on, for example, at its destination location, particularly in a vehicle. Because of the embodiment of the fastening form element in the first injection cavity, and thus in the first tool part, a keyed connection between the housing and the first tool part is ensured during the production process, whereby the first tool part can be used especially well as fastening or mounting support of the housing over the entire production. One further embodiment provides that the second tool part includes a plug cavity slide, during the molding of the carrier element with the housing, the plug cavity slide determining a plug cavity round about a connecting pin of the carrier element. Because of the individual embodiment of the fastening form element and/or the plug cavity, the most varied, customer-individual plug systems may be implemented, independently of the carrier element and the microcomponent, especially for automotive technology. In addition, because of this, VDA (German Association of the Automotive Industry) interfaces are able to be produced cost-effectively and efficiently.

The present invention also includes an injection molding die, developed to carry out the method just described. The advantageous embodiments of the method according to the present invention, that have already been discussed, for producing the electronic component, are, of course, able to be used advantageously, in a corresponding manner, in the case of the injection molding die according to the present invention.

Furthermore, the present invention includes a carrier element, developed for producing the electronic component according to the method already described, including the microcomponent receptacles having a spring element developed for contacting the microcomponent, a molding component developed for the direct molding around with the housing, in order to fix the carrier element in the housing, and a connecting pin which is developed to remain free from the housing and the filler material. In the finished electronic component, the molding component is in direct contact to the material of the housing, and thus represents the connection between the housing and the carrier element. When two carrier elements are used, the connecting pin, or the two connecting pins must of course remain free from the housing and the filler material, since only in that way can an electrical contact to a cable or plug be ensured. One design of the spring element, namely the characteristics of its spring characteristic curve, may be defined via the geometric design as well as via the thickness of the carrier element. The microcomponent receptacle of the carrier element as well as the cavity of the electronic component are dimensioned, in this context, so that the spring elements do not come into contact with the material of the housing, so that the requisite spring effect for contacting and/or clamping the microcomponent is not influenced.

In one advantageous embodiment of the carrier element it is provided that the carrier element is stamped from sheet metal and the spring element is developed so that it acts upon the microcomponent in a direction parallel to the plane of the sheet metal. That is, advantageously the spring element is not only created by bending out a component of the carrier element from the plane of the sheet metal. The spring element is rather determined by the geometry of the carrier element. The finished carrier element thus extends in a direction perpendicular to the sheet metal exactly as far as the sheet metal is thick. In an additional advantageous embodiment, the carrier elements are stamped from the sheet metal in such a way that a sheet metal stamping strip comes about having a multiplicity of connected carrier elements. This advantageously makes possible reel-to-reel electroplating. Cutting apart the carrier elements advantageously takes place by a stamping process in the final assembly.

In one preferred embodiment, the microcomponent receptacle includes a stop, so that one is able to position the microcomponent accurately. Because of this, the position of the microcomponent relative to the housing and relative to the carrier element is defined in a push-in direction.

Furthermore, the present invention includes a sensor, particularly an acceleration sensor, for use in a motor vehicle, including an electronic component, produced by the method according to the present invention that has already been described, particularly having an injection molding die according to the present invention and particularly having a carrier element according to the present invention, the microcomponent including a microelectromechanical sensor. The advantages described, especially the cost-effective and reliable-process production, even of larger piece numbers of the electronic component, achieve prominence particularly in the case of the use of the electronic component as sensor in automobile technology. An additional advantage is that the housing having the fastening form element and/or a plug cavity is able to be adapted to customer-specific requirements and interfaces of a vehicle.

BRIEF DESCRIPTION OF THE DRAWINGS

FIG. 4 shows three views of a microcomponent used according to an exemplary embodiment.

FIG. 5 shows a possible arrangement of electronic components within the microcomponent, according to an exemplary embodiment.

FIG. 6 shows three sectional views of a housing without a microcomponent, according to an exemplary embodiment.

FIG. 7 shows three ghosted views having a mounted microcomponent according to an exemplary embodiment.

FIGS. 17 to 19 show a schematic sequence of the injecting full of a cavity, using a filler material according to an exemplary embodiment.

DETAILED DESCRIPTION OF THE INVENTION

Figure 1:
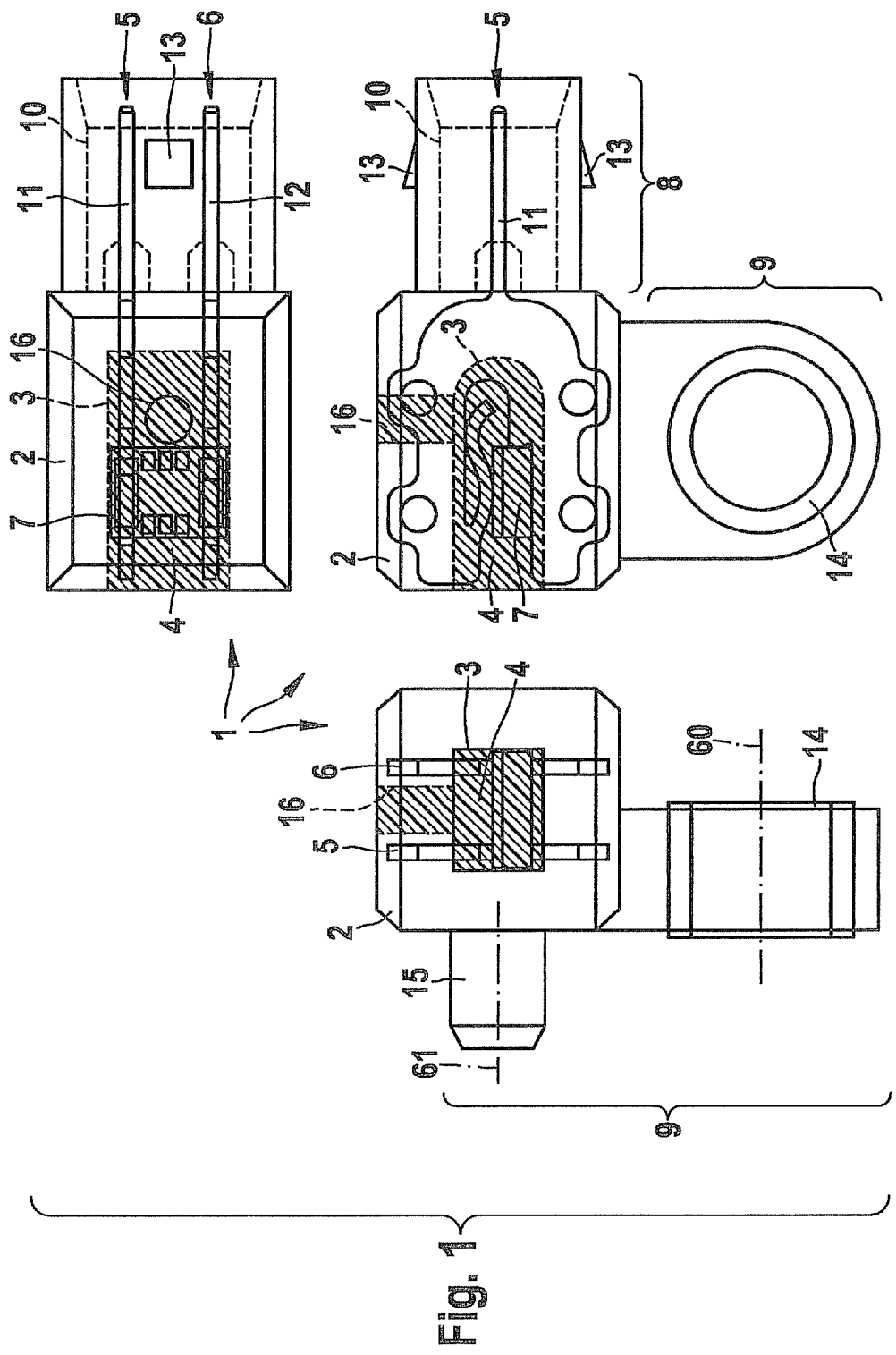
FIG. 1 shows three ghosted views of the electronic component according to the present invention, as in an exemplary embodiment.

FIG. 1 shows a finished electronic component 1, developed as an acceleration sensor for use in automotive technology, produced by a method according to the present invention for producing electronic component 1 according to an exemplary embodiment. For this, FIG. 1 shows three different views of electronic component 1 in a ghosted view.

Electronic component 1 includes a housing 2 made of a thermoplastic, having a cavity 3 developed in it, that is laterally open. This cavity 3 is injected full of a filler material 4, made up of silicone. Into housing 2, a first carrier element 5 has also been injection molded in parallel with, and set apart from a second carrier element 6. First carrier element 5 and second carrier element 6 are each metallic and conductive. Encased by filler material 4 and contacted to first carrier element 5 and second carrier element 6, a microcomponent 7 is seated in cavity 3 of housing 2.

The outer shape of housing 2 has a connection form element 8 and a fastening form element 9. Connection form element 8 includes a plug cavity 10, into which a first connecting pin 11 of first carrier element 5 extends and a second connecting pin 12 of second carrier element 6 extends. Furthermore, connection form element 8 includes a plug securing device 13 in the form of two latches. This connection form element 8 is used for setting a plug onto housing 2 and thus to connect first connecting pin 11 and second connecting pin 12 with a cable, for example.

The fastening form element includes an injection molded metallic socket 14 as well as an anti-rotation element 15, developed as a cylindrical neck. An axis 60 of socket 14 is parallel to another axis 61 of anti-rotation element 15, in this instance, so that electronic component 1 is able to be screwed on in an anti-rotational manner at an interface, using only one screw or bolt.

It may further be seen in FIG. 1 that, in housing 2 of electronic component 1, a ventilation channel 16 has been developed. This ventilation channel 16 is also filled up with filler material 4. This ventilation channel 16 may be advantageous when cavity 3 is injected full of filler material 4, but it is not absolutely necessary.

Figure 2:
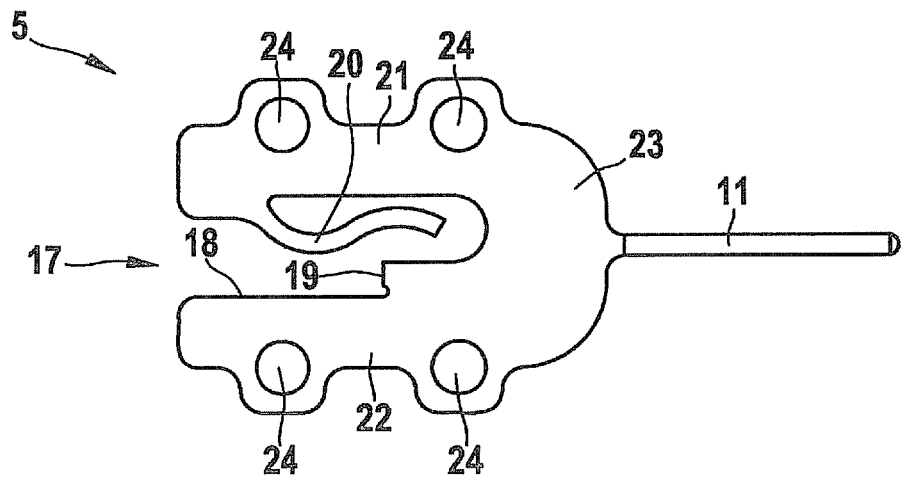
FIG. 2 shows a carrier element according to the present invention, as in an exemplary embodiment.

FIG. 2 shows first carrier element 5, according to the present invention, as an exemplary embodiment. As was pointed out with reference to FIG. 1, electronic component 1 includes both a first carrier element 5 and a second carrier element 6. These two carrier elements 5, 6 are situated parallel to each other in electronic component 1, and are both used to contact and clamp microcomponent 7. In FIG. 2 as well as, in part, in diverse following figures, only first carrier element 5 is discussed. One should note, however, that first carrier element 5 and second carrier element 6 are designed absolutely identically, and some figures show only first carrier element 5, for reasons of simplified presentation.

First carrier element 5 includes a microcomponent receptacle 17, a first connecting region 21, a second connecting region 22, a connecting arch 23 and first connecting pin 11.

Important elements of microcomponent receptacle 17 are seat 18, stop 19 and spring element 20. The exact design of spring element 20 and its function for clamping microcomponent 7 will be explained more exactly with reference to FIGS. 8 to 11. Seat 18 is used both to guide microcomponent 7 during assembly and as a counter-surface to spring element 20. As will be described with reference to FIGS. 8 to 11, microcomponent 7 is clamped between spring element 20 and seat 18. In order to position accurately microcomponent 7 both with respect to housing 2 and with respect to spring element 20, microcomponent seat 18 has a stop 19.

Seat 18 turns directly into second connecting region 22. Spring element 20 is connected to first connecting region 21. First connecting region 21, having spring element 20, is opposite to second connecting region 22, having seat 18. First connecting region 21 is connected to second connecting region 22 via connecting arch 23 on one side, so that microcomponent receptacle 17 is designed to be arch-shaped.

First connecting region 21, second connecting region 22 and connecting arch 23 together represent an injection molding portion of first carrier element 5. When housing 2 is injection molded, this injection molding portion comes into direct contact with the material of housing 2, and thus represents the connection between first carrier element 5 and housing 2. In order to improve this connection even more, altogether four through holes 24 are developed in first connecting region 21 as well as in second connecting region 22, which fill up with the material of housing 2. Furthermore, first connecting pin 11 is developed at connecting arch 23.

Figure 3:
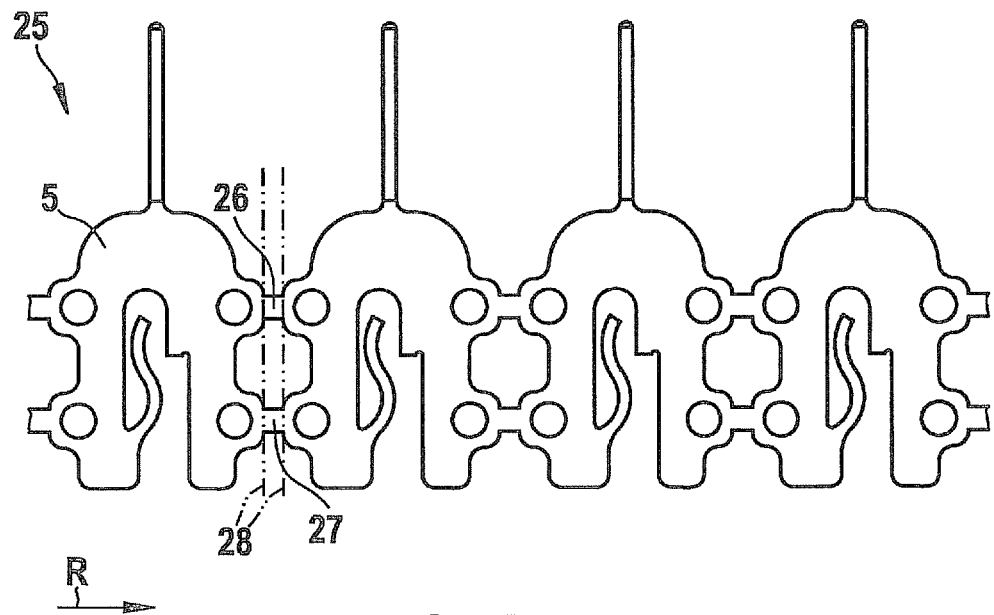
FIG. 3 shows a sheet metal stamping strip having a plurality of carrier elements according to the present invention, as in an exemplary embodiment.

FIG. 3 shows how carrier elements 5, 6 are produced in one stamping process from one sheet of metal. Stamping strip 25, shown in FIG. 3, is created by this method of production. This stamping strip 25 is a lining up of a plurality of carrier elements 5, 6 which in each case are connected to one another via a first connecting element 26 that can be cut off and a second connecting element 27 that can be cut off. Connecting elements 26, 27 that can be cut off, in each case extend, in this instance, from first connecting region 21 of the one carrier element 5, 6 to the second connecting region 22 of the other carrier element 5, 6. Stamping strip 25 is submitted to a reel-to-reel electroplating process before being cut apart.

Before carrier elements 5, 6 are used in electronic component 1 they have to be cut apart. To do this, first connecting element 26, that can be cut off, and second connecting element 27, that can be cut off, are cut off along separating line 28 that is drawn in.

Moreover, the plane of the sheet metal of which carrier elements 5, 6 were produced is easy to recognize, with reference to stamping strip 25 shown in FIG. 3. This also makes it clear that spring element 20 of first carrier element 5 is located in this plane of the sheet metal, and is consequently able to apply a spring force for clamping and contacting microcomponent 7 in a direction R.

FIGS. 4 and 5 show microcomponent 7 as it is used in the exemplary embodiment. FIG. 4 shows a view of microcomponent 7 from below, as well as two lateral views. FIG. 5 shows microcomponent 7 without mold compound.

Microcomponent 7 includes a circuit board 29 having a microelectromechanical sensor (MEMS) 34 situated on it, an application-specific integrated circuit (ASIC) 35 and four microchips (SMD) 36. Microelectromechanical sensor 34, application-specific integrated circuit 35 and microchips 36 are completely molded around with a mold compound 30. On the lower side of circuit board 29, a first contact pad 31, a second contact pad 32 and six programming pads 33 are developed.

Microcomponent 7 was produced in a large matrix, a plurality of equal microcomponents 7 being assembled next to one another and molded. After that, individual microcomponents 7 were cut apart by sawing or laser depaneling and were cut to exact parallelepipeds.

Programming pads 33 located on the lower side are used in the production and the checking of microcomponent 7. First contact pad 31 and second contact pad 32 are decisive within the scope of electronic component 1. First contact pad 31 is contacted to first carrier element 5. Second contact pad 32 is contacted to second carrier element 6. Consequently, in the finished electronic component, first connecting pin 11 is connected to first contact pad 31. Second contacting pin 12 is connected to second contact pad 32.

FIG. 6 shows three different sectional views of housing 2 with injection molded first carrier element 5 and injection molded second carrier element 6. In this context, it is easily seen how cavity 3 remains free of the material of housing 2. In the same way, a ventilating channel 16 remains free which connects a rear region of cavity 3 to the outside of housing 2. The first connecting pin 11 and second connecting pin 12 extend into plug cavity 10, which make possible the electrical contact via first contact pad 31 and second contact pad 32 to the microcomponent 7.

FIG. 7 shows three ghosted views of housing 2 having injection molded first carrier element 5 and injection molded second carrier element 6, as well as ready mounted microcomponent 7, but before cavity 3 is injected full of filler material 4. In this context, it is easily seen how microcomponent 7 comes to rest both on first carrier element 5 and on second carrier element 6. The exact positioning of microcomponent 7 within first carrier element 5 and second carrier element 6 will be explained in greater detail with reference to the following FIGS. 8 to 11. In FIG. 7 it may also be seen that cavity 3 has a first sidewall 3a and a second sidewall 3b. First sidewall 3a and second sidewall 3b impinge approximately on microcomponent 7, so that microcomponent 7 is guided laterally through cavity 3 and is able to be positioned relatively accurately to housing 2.

Figure 8:
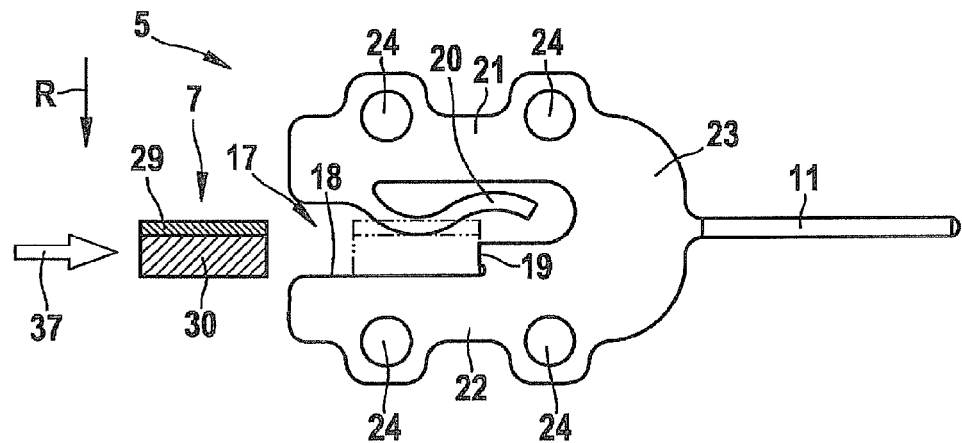
FIG. 8 shows a schematic representation of the assembly of the microcomponent in the carrier element, according to an exemplary embodiment.

In a schematic view, FIG. 8 shows the assembly of microcomponent 7 in microcomponent receptacle 17 of first carrier element 5. As has already been made clear with the aid of FIG. 7, microcomponent 7 is, of course, mounted simultaneously in first carrier element 5 and second carrier element 6. However, in FIG. 8 only first carrier element 5 is shown, to make the illustration simpler. Furthermore, in FIG. 8, housing 2 that surrounds first carrier element 5 has been made invisible.

The arrow shown in FIG. 8 indicates an assembly direction 37. In this assembly direction 37 microcomponent 7 is pushed into microcomponent receptacle 17. The dashed-dotted representation of ready mounted microcomponent 7 in FIG. 8 indicates the end position of microcomponent 7. The overlapping of spring element 20 with the theoretical end position of microcomponent 7 is drawn in. This overlapping indicates the spring excursion of spring element 20. Since spring element 20 is deformed by this spring excursion, spring element 20 is able to effect a spring force on microcomponent 7 along direction R. Because of this, microcomponent 7 is clamped between spring element 20 and seat 18, and contacted at the same time.

Figure 9:
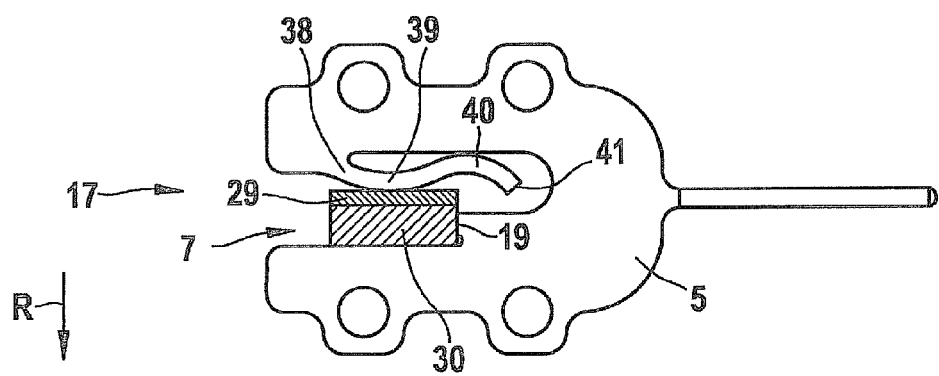
FIGS. 9 to 11 show three views of the carrier element having a mounted microcomponent according to an exemplary embodiment.
Figure 10:
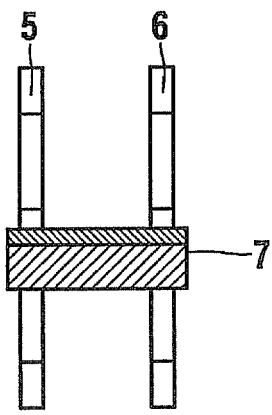
Figure 11:
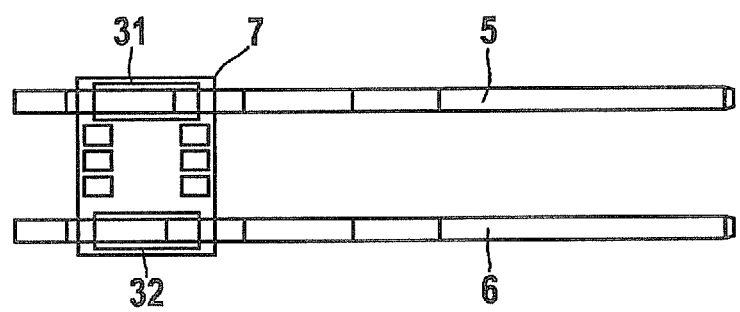

Now FIGS. 9 to 11, while making invisible second carrier element 6 and housing 2, show the final position of microcomponent 7 in first carrier element 5 and in microcomponent receptacle 17. In the illustrations according to FIGS. 9 to 11, spring element 20 is shown deformed, and consequently exerts a spring force along direction R on microcomponent 7.

As was shown more accurately in FIG. 9, spring element 20 includes a fixed end 38, connected to first connecting region 21, a first arch 39, a second arch 40 as well as a loose, or rather free end 41. First arch 39 faces towards microcomponent 7 and seat 18. Moreover, first arch 39 turns directly into second arch 40. This second arch 40 is bent in the opposite direction to arch 39, and thus has an arch facing first connecting region 21. Second arch 40 is connected on one side to first arch 39, or rather turns into it. On the other side, second arch 40 ends with free end 41 of spring element 20.

As shown in FIG. 9, when microcomponent 7 is assembled, first arch 39 lies on microcomponent 7, while second arch 40 lies against upper connecting region 21. Because the position of assembled microcomponent 7 is defined by stop 19 as well as by the lateral guidance of sidewalls 3a and 3b, first arch 39 is located at an exactly defined place of microcomponent 7, namely, at first contact pad 31. Because of this exact positioning, not only is the fixed clamping of microcomponent 7 in microcomponent receptacle 17 ensured, but also the accurate contacting of first carrier element 5 to first contact pad 31 and second carrier element 6 to second contact pad 32. This once more makes clear the top view according to FIG. 11.

Now, it was shown how carrier elements 5, 6 of electronic component 1 may be produced in a simple and efficient manner. Spring elements 20 of carrier elements 5, 6 enable the fixed clamping as well as the contacting of microcomponent 7, without the use of soldering points, and particularly without the use of lead-containing solders. The final fixing of microcomponent 7 as well as its damping-free and insulated positioning was implemented only after the production of the housing by injecting filler material 4. This makes it possible to produce the housing the usual high pressures and temperatures, without damaging filler material 4 or microcomponent 7. All these advantages will be made clear once more in the following description of an injection molding die 42, according to the present invention, as is used according to an exemplary embodiment.

Figure 12:
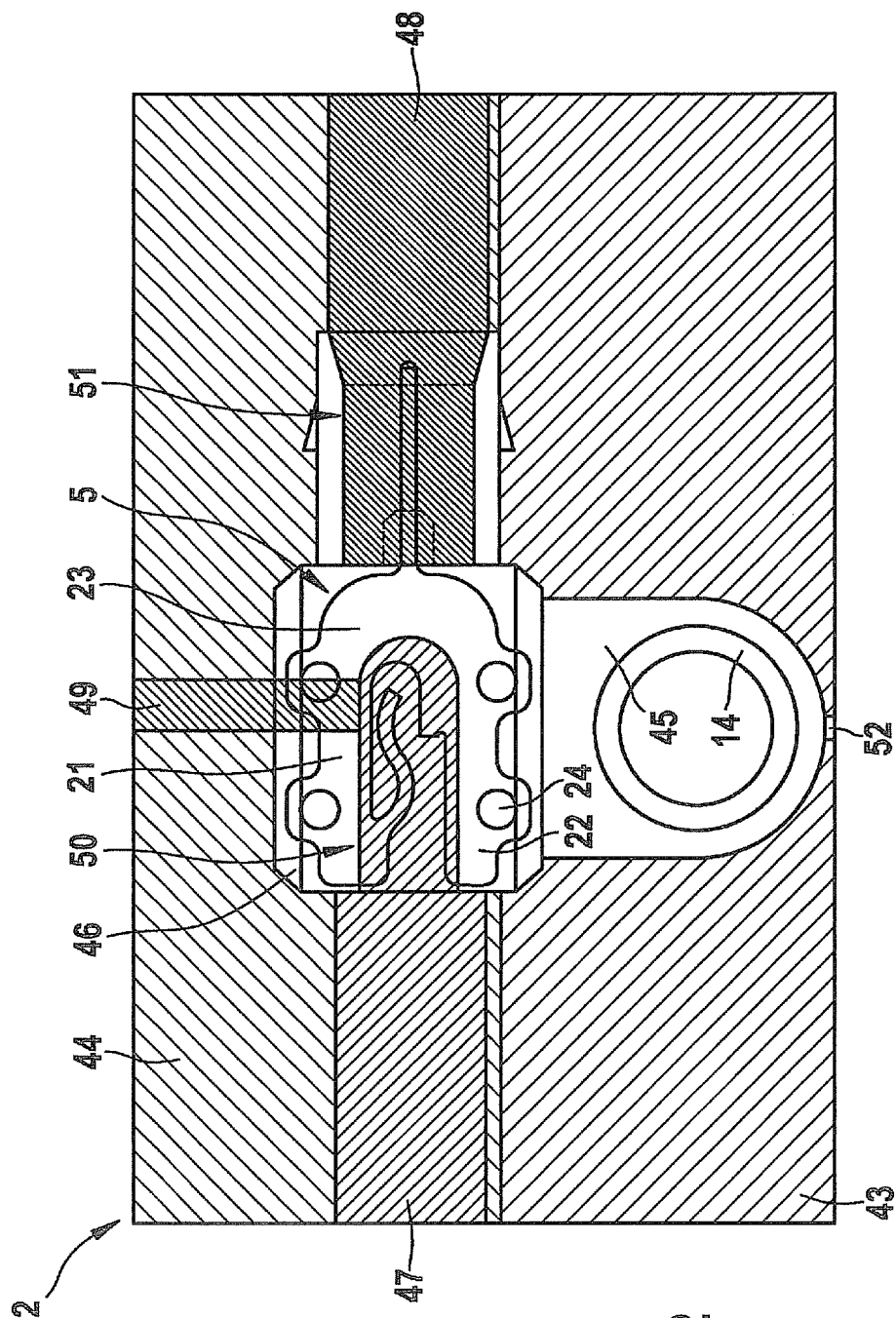
FIGS. 12 to 14 show a schematic sequence for producing the housing an injection molding die according to the present invention, as in an exemplary embodiment.
Figure 13:
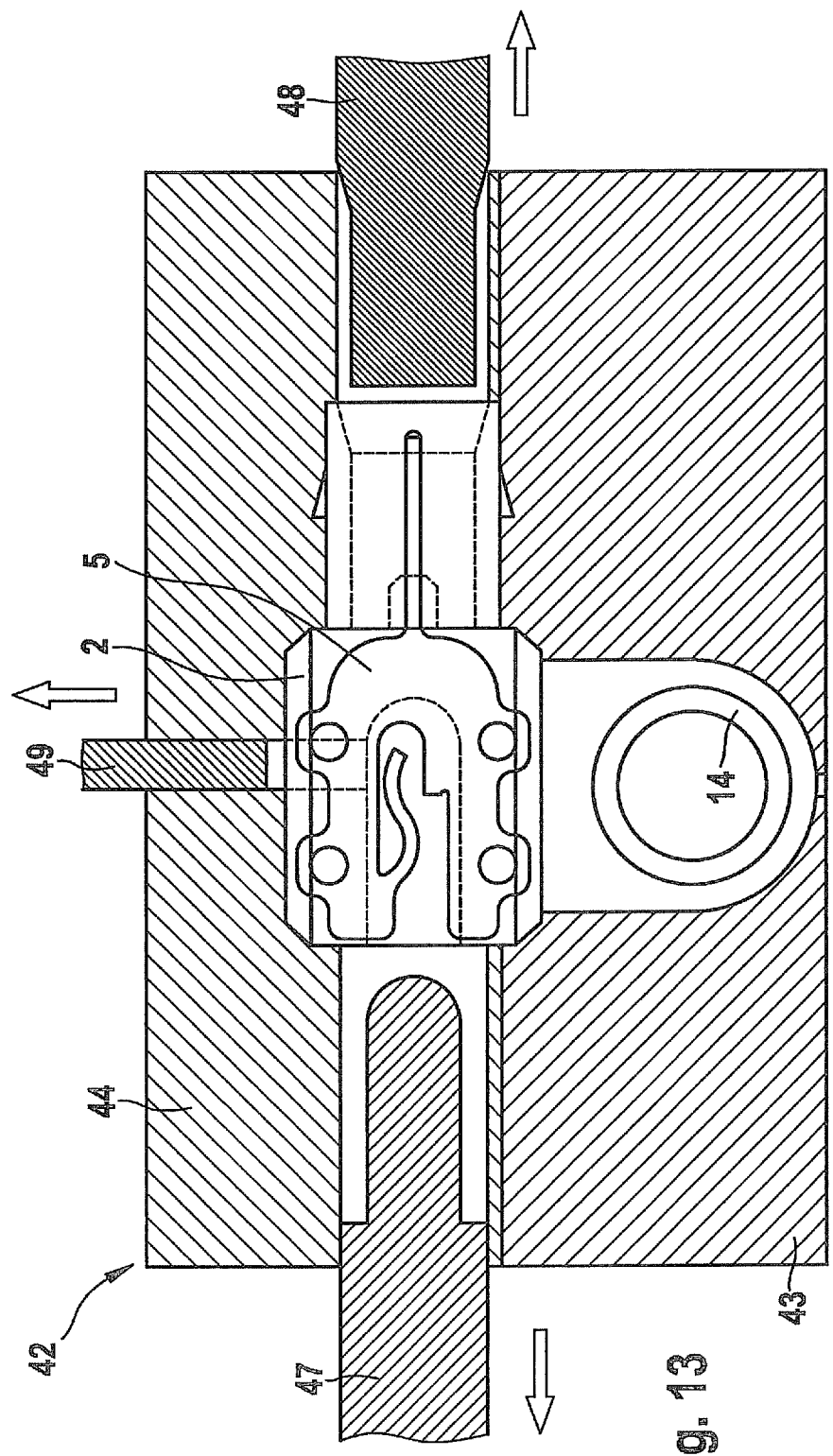
Figure 14:
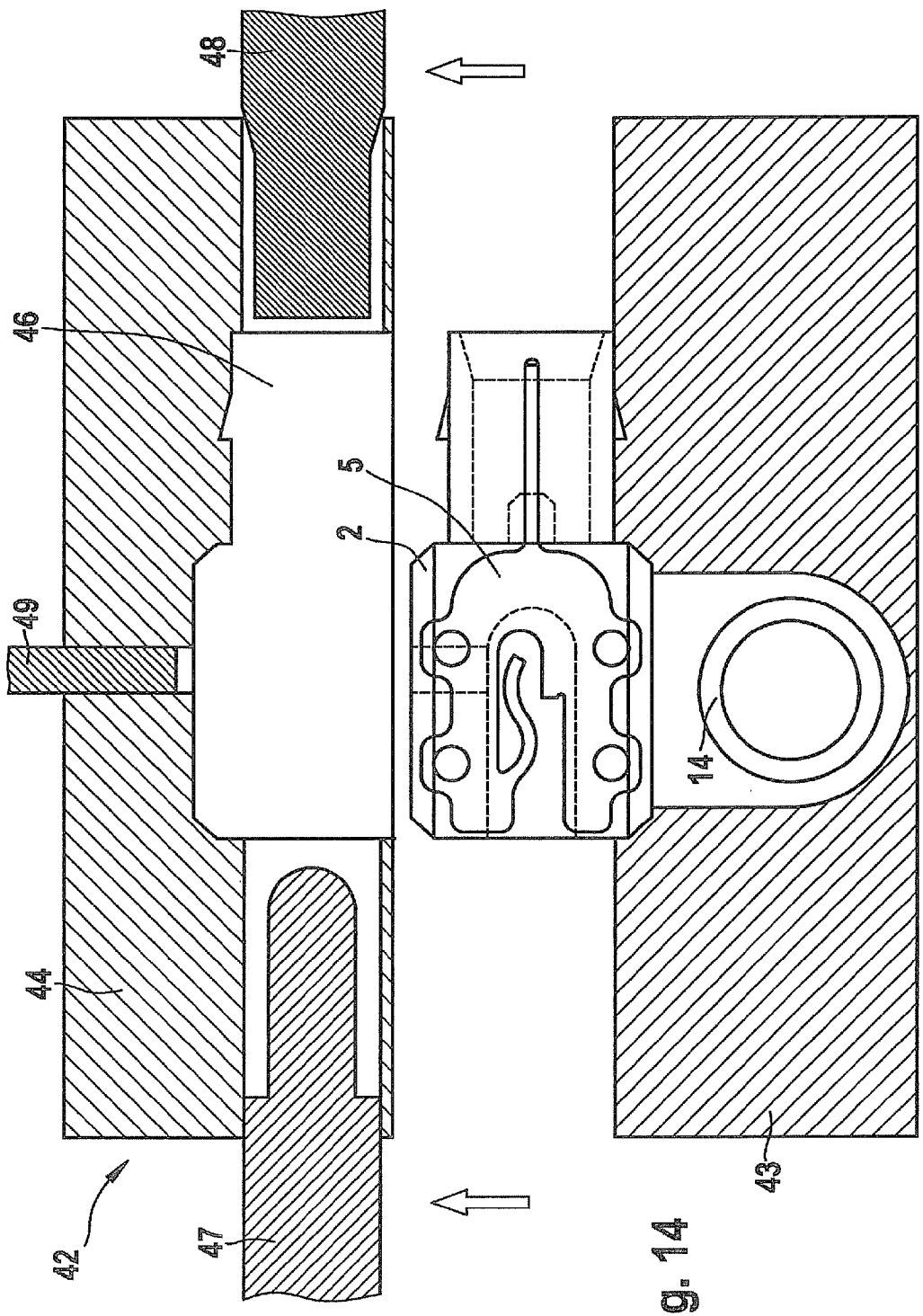

FIGS. 12 to 14 show injection molding die 42, as used in the exemplary embodiment, and the sequence of the production method using injection molding die 42, as in the exemplary embodiment.

As is made clear in FIG. 12, injection molding die 42 is made up of a first tool part 43 and a second tool part 44. In the closed state, as shown in FIG. 12, a first injection molding cavity 45, that is developed in the first tool part 43, and a second injection molding cavity 46, that is developed in second tool part 44, together form the inverse shape of housing 2.

Furthermore, in second tool part 44, a cavity slide 47, a plug cavity slide 48 as well as a ventilation channel cavity slide 49 are situated. Cavity slide 47 includes a cavity-shaping element 50. This cavity-shaping element 50 corresponds exactly to cavity 3, that is to remain free when housing 2 is molded, so as to make possible mounting microcomponent 7. This cavity slide 47 with its cavity-shaping element 50 makes it possible, in particular, that microcomponent receptacle 17, inclusive of spring element 20, stop 19 and seat 18 remain free of material of housing 2 during the injection molding process.

Plug cavity slide 48 includes a plug cavity shaping element 51. The contour of this plug cavity shaping element 51 corresponds to plug cavity 10 and ensures that first connecting pin 11 as well as second connecting pin 12 remain free of the material of housing 2. Ventilation channel cavity slide 49 defines ventilation channel 16, which will be needed later for the reliable injection of cavity 3 with filler material 4.

Fastening form element 9 is advantageously developed in lower first tool part 43. As will be shown in the following figures, this first tool part 43 is used over the entire production process as mounting support or fastening of housing 2. In this context, fastening form element 9 is used during the production as a form locking connection between housing 2 and first tool part 43.

Furthermore, before the injection of housing 2 into injection molding die 43, socket 14 is inserted into first injection molding cavity 45.

After the insertion of first carrier element 5, second carrier element 6 and socket 14, as well as after closing cavity slide 47, plug cavity slide 48 and ventilation channel cavity slide 49, liquid thermoplastic is injected via a sprue opening 52 into first injection molding cavity 45 and second injection molding cavity 46, which creates housing 2.

FIG. 13 shows how, after the hardening of housing 2, cavity slide 47, plug cavity slide 48 and ventilation channel cavity slide 49 are pulled out of housing 2.

According to the illustration in FIG. 14, the entire second tool part 44 is removed from housing 2. However, housing 2 remains in first injection molding cavity 45 of first tool part 43 so that first tool part 43 continues to be used in the subsequent production process as mounting support and fastening of housing 2.

Figure 15:
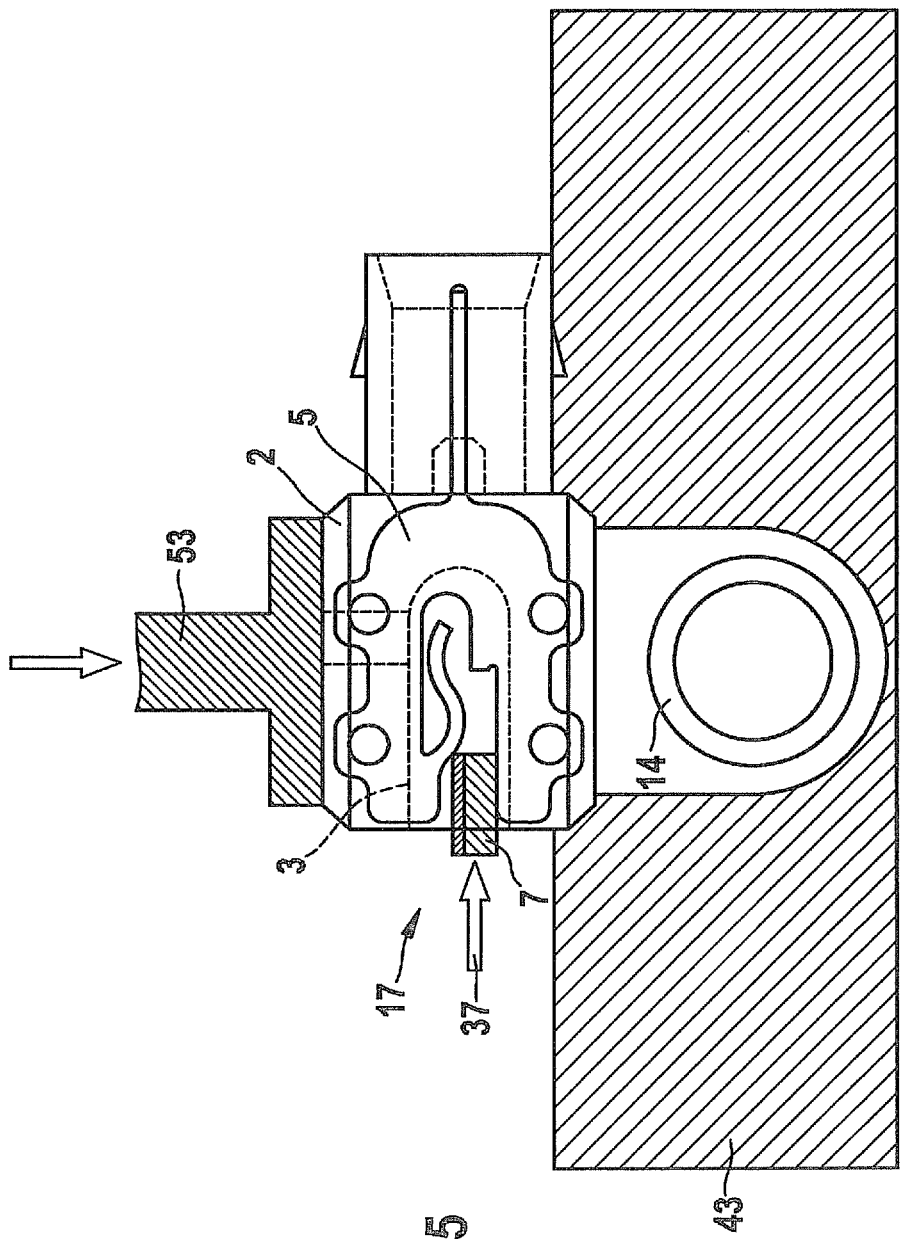
FIGS. 15 and 16 show a schematic sequence of the assembly of the microcomponent according to an exemplary embodiment.
Figure 16:
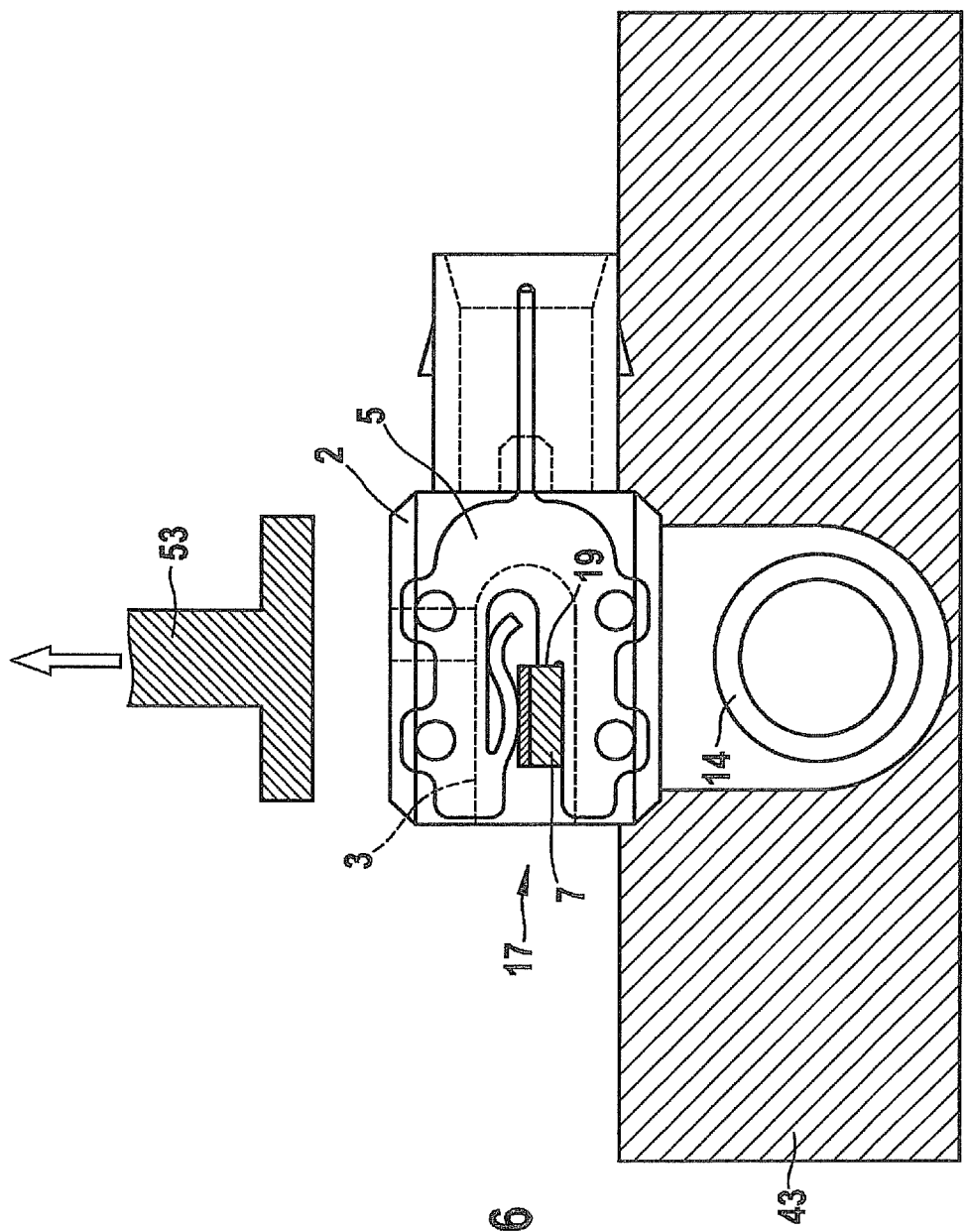

FIGS. 15 and 16 show how, in a next method step, microcomponent 7 is introduced into microcomponent receptacle 17 along assembly direction 37. To do this, a plunger 53 is lowered onto housing 2, so that the housing remains firmly in first tool part 43. Then a microcomponent 7 is pushed along assembly direction 37 into cavity 3, whereby microcomponent 7 is both clamped and contacted by spring elements 20.

FIG. 16 shows finished positioned microcomponent 7, as well as the backing up of plunger 53.

Figure 17:
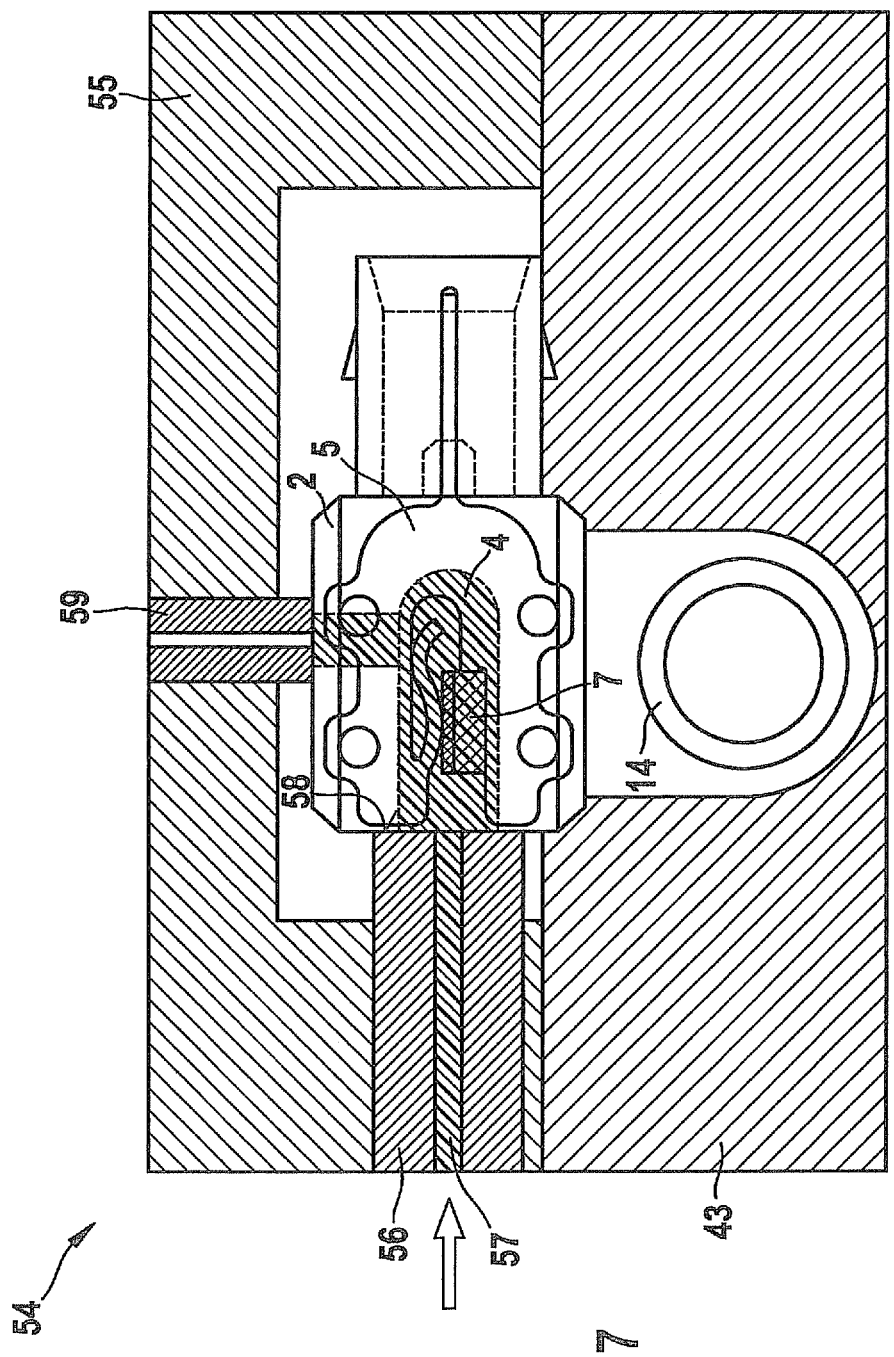
Figure 18:
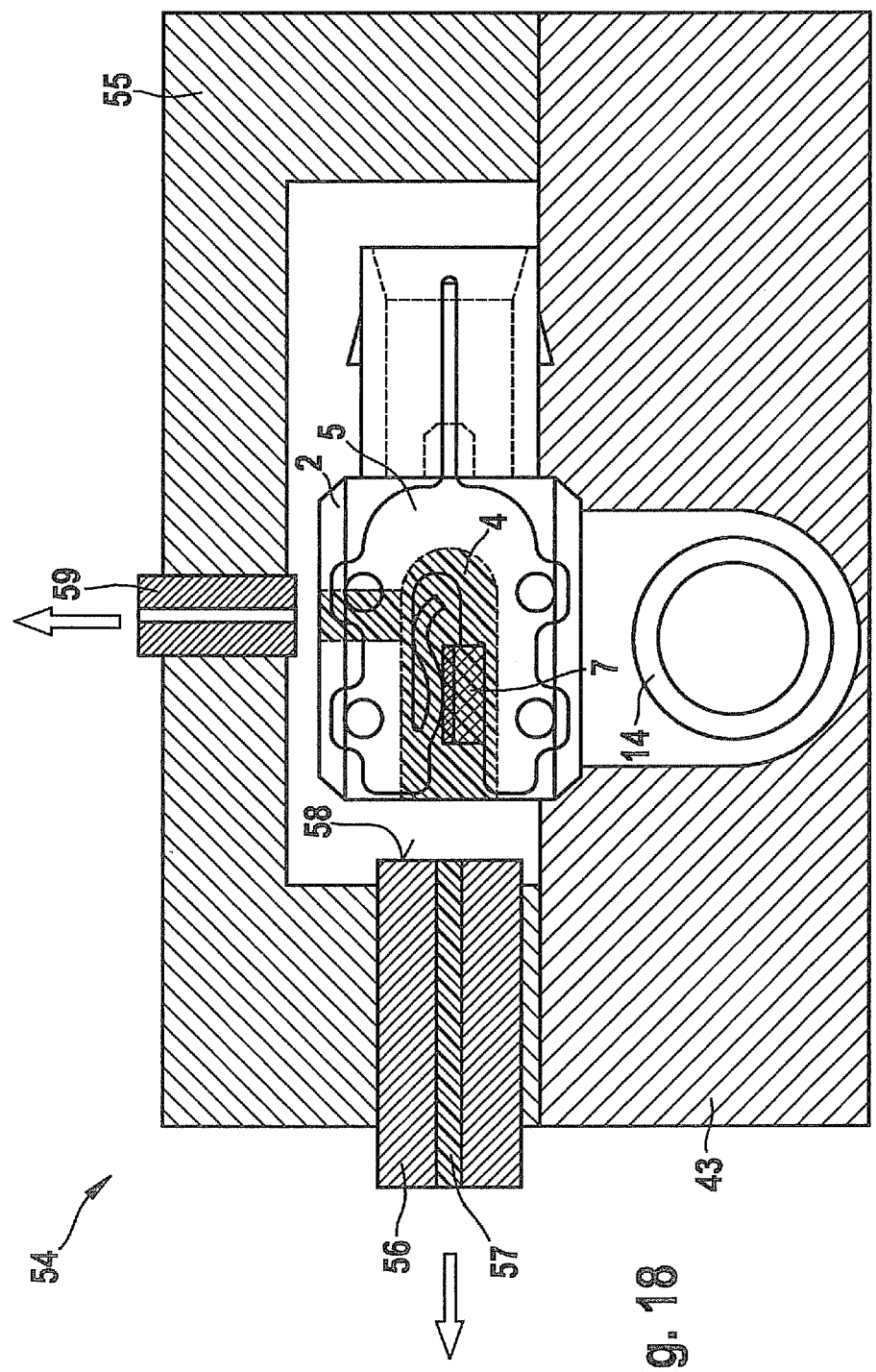

FIGS. 17 and 18 show the injecting of cavity 3 with filler material 4. A filler material injection molding die 54 is used for this. This filler material injection molding die 54 is made up of a carrier 55, in which an injection slide 56 is situated, as well as a ventilation channel slide 59. An injection channel 57 is worked into injection slide 56. Furthermore, injection slide 56 includes a tight seat 58 facing housing 2, in order to connect injection channel 57 tightly to cavity 3.

Housing 2 having mounted microcomponent 7 remains in first tool part 43 even during the injection of filler material 4. Onto this first tool part 43, carrier 55 of filler material injection molding die 54 is lowered. Thereupon, injection slide 56 and ventilation channel slide 59 are applied onto housing 2. Cavity 3 is filled with filler material 4 via injection channel 57. As shown in FIG. 18, injection slide 56 and ventilation channel slide 59 are then pulled back from housing 2.

In a last method step according to FIG. 19, the whole filler material injection molding die 54 as well as first tool part 43 are removed from electronic component 1, which is now finished. The electronic component may now be deburred and freed of sprues.

FIGS. 12 to 19 show how the electronic component may advantageously be produced using injection molding die 42. It was made clear, in this context, how it is possible first to produce the outer portion, namely housing 2, and only then to mount sensitive microcomponent 7, and in a last step, to encase sensitive microcomponent 7 in a filler material 4 and thus to fix it firmly in housing 2. Housing 2 remains in first tool part 43 during the entire production, and thus does not have to be repositioned into various receptacles. For this purpose, first tool part 43 is advantageously located on a rotary table having four positions, the positions being distributed as follows: The injection molding of housing 2 takes place at the first position; at the second position, microcomponent 7 is pushed into microcomponent receptacle 17; at the third position, cavity 3 is injected full of filler material 4, and at the fourth position the removal of electronic component 1 takes place as well as the renewed providing of injection molding die 42 with first carrier element 5, second carrier element 6 as well as socket 14 for the production of subsequent electronic component 1.

What is claimed is:

1. A method for producing an electronic component, comprising:
    providing at least one carrier element including a microcomponent receptacle configured for contacting at least one microcomponent;
    injection molding a housing around the carrier element such that the microcomponent receptacle is situated in a cavity of the housing, wherein the cavity is open on least on one side;
    introducing the at least one microcomponent into the microcomponent receptacle situated in the cavity in order to contact the at least one microcomponent to the carrier element; and
    injecting a filler material into the cavity in order to fix the at least one microcomponent in the housing and in the microcomponent receptacle;
    wherein the method is performed using a multi-part injection molding die including a first tool part having a first injection molding cavity, a second tool part having a second injection molding cavity, and a cavity slide, wherein the first injection molding cavity and the second injection molding cavity together determine an outer shape of the housing, and wherein during the injection molding of the housing around the carrier element, the cavity slide extends into at least one of the first and second injection molding cavities to define the cavity of the housing; and
    wherein for the introduction of the microcomponent into the microcomponent receptacle, the housing remains in the first tool part, and the second tool part and the cavity slide are set apart from the housing.

2. The method as recited in claim 1, wherein the electronic component includes two carrier elements, and the microcomponent includes two contact pads which are each contacted by a microcomponent receptacle of a respective carrier element, the two microcomponent receptacles of the two carrier elements being situated together in the cavity.

3. The method as recited in claim 1, wherein the cavity is larger than the microcomponent such that the microcomponent is completely encased by the filler material, with the exception of a portion of the microcomponent in contact with at least one of the carrier element and the housing.

4. The method as recited in claim 1, wherein the microcomponent is clamped in the microcomponent receptacle in response to the introduction of the microcomponent into the microcomponent receptacle.

5. A method for producing an electronic component, comprising:
    providing at least one carrier element including a microcomponent receptacle configured for contacting at least one microcomponent;
    injection molding a housing around the carrier element such that the microcomponent receptacle is situated in a cavity of the housing, wherein the cavity is open on least on one side;
    introducing the at least one microcomponent into the microcomponent receptacle situated in the cavity in order to contact the at least one microcomponent to the carrier element; and
    injecting a filler material into the cavity in order to fix the at least one microcomponent in the housing and in the microcomponent receptacle;
    wherein the method is performed using a multi-part injection molding die including a first tool part having a first injection molding cavity, a second tool part having a second injection molding cavity, and a cavity slide, wherein the first injection molding cavity and the second injection molding cavity together determine an outer shape of the housing, and wherein during the injection molding of the housing around the carrier element, the cavity slide extends into at least one of the first and second injection molding cavities to define the cavity of the housing; and
    wherein for the injecting of the filler material into the cavity of the housing, the housing remains in the first tool part, and the filler material is injected into the cavity of the housing via an injection slide.

6. The method as recited in claim 1, wherein the first injection molding cavity determines a fastening form element of the housing.

7. The method as recited in claim 1, wherein the second tool part includes a plug cavity slide, and wherein during the injection molding of the housing around the carrier element, the plug cavity slide determines a plug cavity around a connecting pin of the carrier element.

* * * * *